(12) United States Patent
Ishio et al.

(10) Patent No.: US 6,897,669 B2
(45) Date of Patent: May 24, 2005

(54) SEMICONDUCTOR DEVICE HAVING BONDING PADS AND PROBE PADS

(75) Inventors: Seiichiro Ishio, Kariya (JP); Yasutoshi Suzuki, Okazaki (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/635,492

(22) Filed: Aug. 7, 2003

(65) Prior Publication Data

US 2004/0032279 A1 Feb. 19, 2004

(30) Foreign Application Priority Data

Aug. 19, 2002 (JP) ........................................ 2002-237907

(51) Int. Cl.⁷ .......................... G01R 31/27; H01L 23/58
(52) U.S. Cl. .......................................... 324/757; 257/48
(58) Field of Search ............................ 257/48; 324/765, 324/757, 758

(56) References Cited

U.S. PATENT DOCUMENTS

| | | | | |
|---|---|---|---|---|
| 5,036,383 A | * | 7/1991 | Mori ........................... | 257/751 |
| 5,404,047 A | * | 4/1995 | Rostoker et al. ............. | 257/786 |
| 5,441,917 A | * | 8/1995 | Rostoker et al. ............. | 438/612 |
| 5,506,499 A | | 4/1996 | Puar | |
| 5,554,940 A | * | 9/1996 | Hubacher ..................... | 324/765 |
| 5,635,424 A | * | 6/1997 | Rostoker et al. ............. | 438/612 |
| 5,656,385 A | * | 8/1997 | Nakajima et al. .......... | 428/694 T |
| 5,923,072 A | * | 7/1999 | Wada et al. .................. | 257/473 |
| 6,395,622 B1 | * | 5/2002 | Liu et al. ..................... | 438/497 |
| 6,534,853 B2 | * | 3/2003 | Liu et al. ..................... | 257/692 |
| 6,784,556 B2 | * | 8/2004 | Lin .............................. | 257/784 |
| 2002/0011651 A1 | | 1/2002 | Ichinose | |
| 2003/0173667 A1 | * | 9/2003 | Yong et al. .................. | 257/748 |
| 2004/0089954 A1 | * | 5/2004 | Hembree et al. ........... | 257/780 |

FOREIGN PATENT DOCUMENTS

| | | |
|---|---|---|
| JP | A-62-239541 | 10/1987 |
| JP | A-62-261139 | 11/1987 |
| JP | A-5-121501 | 5/1993 |
| JP | A-5-129305 | 5/1993 |
| JP | A-7-111282 | 4/1995 |
| JP | A-7-122604 | 5/1995 |
| JP | B2-2536419 | 7/1996 |
| JP | A-11-233553 | 8/1999 |
| JP | A-2000-232127 | 8/2000 |

* cited by examiner

*Primary Examiner*—Evan Pert
(74) *Attorney, Agent, or Firm*—Posz Law Group, PLC

(57) ABSTRACT

An external connection wire is externally connected and is bonded to a portion of a predetermined exposed region of a bonding pad, which is exposed through a bonding pad opening of a passivation film. The bonding pad opening of the passivation film has a polygonal shape that has a plurality of corners, and each of the plurality of corners has an obtuse angle or is chamfered. A probe pad is electrically connected to the bonding pad through a conductive line covered with the passivation film. The passivation film is also located on the probe pad and further includes a probe pad opening, through which a predetermined exposed region of the probe pad is exposed. The probe pad opening has a polygonal shape that has a plurality of corners, and each of the plurality of corners has an obtuse angle or is chamfered.

6 Claims, 5 Drawing Sheets

SEMICONDUCTOR DEVICE HAVING BONDING PADS AND PROBE PADS

CROSS REFERENCE TO RELATED APPLICATION

This application is based on and incorporates herein by reference Japanese Patent Application No. 2002-237907 filed on Aug. 19, 2002.

BACKGROUND OF THE INVENTION

1. Field of the Invention

The present invention relates to a semiconductor device that includes a bonding pad, to which an external connection wire is bonded.

2. Description of Related Art

A technique for bonding an external connection wire to a bonding pad of a semiconductor device is disclosed in, for example, Japanese Unexamined Patent Publication No. 11-233553. In this technique, a gold conductive line is used as an external connection wire, and an opening, which corresponds to a gold bulb formed on a bonding pad, is formed through a passivation film provided on the bonding pad. With this arrangement, the opening of the passivation film is closed and is sealed by the gold bulb, and exposure of the bonding pad connected to the gold bulb is prevented. In this way, corrosion of the bonding pad by, for example, water is restrained.

However, in the above prior art technique, the formation of the gold bulb, which seals the opening of the passivation film provided on the bonding pad, requires precise control of a size of the gold bulb and positioning of the gold bulb. This normally results in a time consuming manufacturing process.

Furthermore, Japanese Patent Number 2536419 discloses a semiconductor device that includes bonding pads and probe pads, which are alternately arranged on a common surface. Each bonding pad and the corresponding probe pad extend downwardly through corresponding through holes provided in a dielectric film and are then connected to a common lower wiring layer. In such a case, even when the exposed bonding pad is corroded, the bonding pad is electrically connected to an internal electronic circuit of the semiconductor device through the corresponding through hole and the lower wiring layer. However, formation of the through holes in the dielectric film and filling of conductive material in the through holes require more complicated manufacturing process and more complicated semiconductor device.

Thus, it is desired to develop a technique for bonding an external connection wire only to a portion of a predetermined exposed region of a bonding pad exposed through an opening of a passivation film provided on the bonding pad while restraining corrosion of the bonding pad in a relatively simple manner. It is an objective of the present invention to address the above disadvantages and thus provides the above desired technique.

To achieve the objective of the present invention, there is provided a semiconductor device that includes a substrate, a bonding pad, a passivation film and an external connection wire. The bonding pad is located on one side of the substrate. The passivation film is provided on the bonding pad and has a bonding pad opening, through which a predetermined exposed region of the bonding pad is exposed. The external connection wire is externally connected and is bonded to a portion of the predetermined exposed region of the bonding pad, which is exposed through the bonding pad opening of the passivation film. The bonding pad opening of the passivation film has one of a polygonal shape, a generally circular shape and a generally ellipsoidal shape. The polygonal shape has a plurality of corners, and each of the plurality of corners has an obtuse angle or is chamfered.

To achieve the objective of the present invention, there is also provided a method for testing a semiconductor device. According to this method, a distal end of an inspection probe is engaged with a probe engaging point of a predetermined exposed region of a probe pad, which is exposed through a polygonal probe pad opening of a passivation film. Then, electrical voltage is applied from the inspection probe to the probe pad to test electrical characteristics of the semiconductor device. Here, the probe pad is electrically connected to a bonding pad through a conductive line covered with the passivation film. The bonding pad is externally connected through an external connection wire, which is bonded to a portion of a predetermined exposed region of the bonding pad that is exposed through a bonding pad opening of the passivation film. The polygonal probe pad opening of the passivation film has a plurality of corners, and each of the plurality of corners has an obtuse angle or is chamfered. The conductive line extends along an imaginary center line, which connects between a center of the bonding pad and a center of the probe pad. A distance in a direction perpendicular to the imaginary center line between the imaginary center line and a closest one of the corners of the probe pad opening, which is closest to the imaginary center line, is equal to or less than a distance along the imaginary center line between a probe engaging point of the probe pad, which is engaged with the inspection probe at time of testing the semiconductor device, and a bonding pad side edge of the probe pad opening.

BRIEF DESCRIPTION OF THE DRAWINGS

The invention, together with additional objectives, features and advantages thereof, will be best understood from the following description, the appended claims and the accompanying drawings in which:

DETAILED DESCRIPTION OF THE INVENTION

An embodiment of the present invention will be described with reference to the accompanying drawings. In the present embodiment, a semiconductor pressure sensor (serving as a semiconductor device of the present invention) includes bonding pads, probe pads and electrically conductive lines, which respectively connect between the corresponding bonding pad and the corresponding probe pad.

Figure 1:
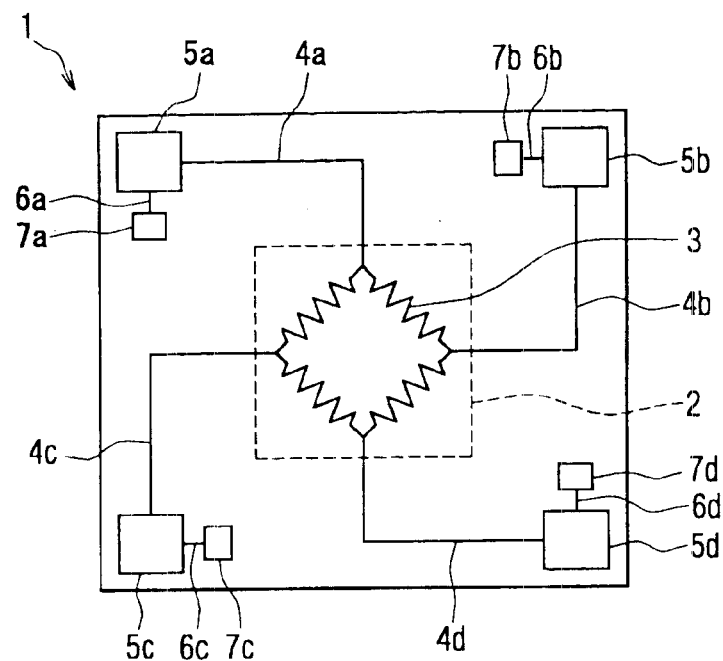
FIG. 1 is a plan view showing a semiconductor pressure sensor according to an embodiment of the present invention.

As shown in FIG. 1, the semiconductor pressure sensor 1 is formed as a semiconductor chip and has a diaphragm 2 in the center thereof. Four gauge resistors (piezo resistors) 3 are provided on the diaphragm 2. These four piezo resistors 3 are interconnected and form a bridge circuit. The bridge circuit is connected to a pair of electrode bonding pads 5a, 5d and a pair of measurement bonding pads 5b, 5c through aluminum conductive lines (hereinafter, simply referred to as aluminum lines) 4a–4d. The electrode bonding pads 5a, 5d are provided to apply electrical voltage to the bridge circuit, and the measurement bonding pads 5b, 5c are provided to output measurement signals of the bridge circuit, which correspond to changes in resistance of each piezo resistor 3.

External connection wires (e.g., gold conductive lines, aluminum conductive lines or the like) are wire bonded to the electrode bonding pads 5a, 5d and the measurement bonding pads 5b, 5c. Thus, the electrode bonding pads 5a, 5d and the measurement bonding pads 5b, 5c are respectively electrically, externally connected to a corresponding external circuit (not shown) through the external connection wires.

Each of the electrode bonding pads 5a, 5d and measurement bonding pads 5b, 5c is electrically connected to a corresponding one of probe pads 7a–7d through a corresponding aluminum conductive line (hereinafter, simply referred to as aluminum lines) 6a–6d. The probe pads 7a–7d are pads, to which a corresponding test probe needle (also referred to as an inspection probe needle or simply referred to as an inspection probe) is engaged to test or examine electrical characteristics of the circuit formed on the pressure sensor chip. That is, the probe needles are engaged with the probe pads 7a, 7d, respectively. Then, a predetermined voltage may be applied to the probe pads 7a, 7d connected to the electrode pads 5a, 5d, or measurement signals may be outputted from the measurement pads 5b, 5c through the probe pads 7b, 7c connected to the measurement pads 5b, 5c.

Figure 2:
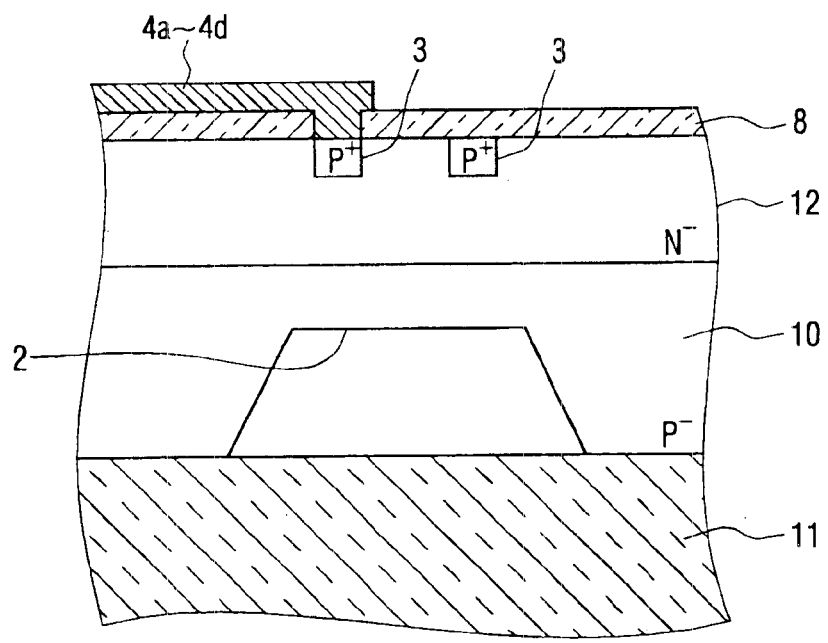
FIG. 2 is a partially enlarged cross sectional view showing the semiconductor pressure sensor of FIG. 1.

With reference to FIG. 2, a substrate of the semiconductor pressure sensor 1 includes a p-type silicon substrate 10 and an n-type epitaxial layer 12. The n-type epitaxial layer 12 is grown on the p-type silicon layer 10. The diaphragm 2 is formed by removing a portion of the p-type silicon substrate 10. The piezo resistors 3 are formed in a top surface of the n-type epitaxial layer 12 of the diaphragm 2.

The top surface of the n-type epitaxial layer 12, in which the piezo resistors 3 are formed, is covered with a field oxide film 8. The aluminum lines 4a–4d are connected to the piezo resistors 3 through contact holes provided through predetermined portions of the field oxide film 8.

The aluminum lines 4a–4d, the electrode and measurement pads 5a–5d, aluminum lines 6a–6d and the probe pads 7a–7d are formed in a common single plane by patterning an aluminum single layer. That is, the aluminum lines 4a–4d, 6a–6d and the pads 5a–5d, 7a–7d are formed as follows. First, aluminum is deposited on the field oxide film 8 through vapor deposition or spattering, and the thus formed aluminum layer is patterned to form the aluminum lines 4a–4d, 6a–6d and the pads 5a–5d, 7a–7d. The material of lines 4a–4d, 6a–6d and the pads 5a–5d, 7a–7d is not limited to the aluminum and can be changed to any other suitable metal material, such as copper, gold, platinum.

Furthermore, although not depicted in FIGS. 1 and 2 for the sake of simplicity, a passivation film made of, for example, silicon nitride film is formed on the field oxide film 8 to cover the wires 4a–4d, 6a–6d and the pads 5a–5d, 7a–7d. The silicon nitride film is deposited on the field oxide film 8 by, for example, a plasma CVD process in such a manner that a thickness of each part of the field oxide film is generally constant.

The pressure sensor chip is arranged in a predetermined pressure measuring point after the pressure sensor chip, which has the above structure, is secured to a glass base 11 (by anode junction) to restrain thermal effects on the formation of a pressure reference chamber or thermal effects on the pressure sensor chip. At the time of securing the pressure sensor chip to the glass base 11, the pressure sensor chip is in a form of a wafer, which is a form before separating each sensor chip from others through a dicing process, and the wafer is joined to the single glass base. Thereafter, the sensor chips are diced along with the glass bases to separate the sensor chips from one another.

Next, the bonding pads 5a–5d, the probe pads 7a–7d and the aluminum lines 6a–6d will be described. The pads 5a–5d, 7a–7d are substantially identical to one another, and the aluminum lines 6a–6d are substantially identical to one another. Thus, only the pads 5a, 7a and the aluminum line 6a will be described.

Figure 3:
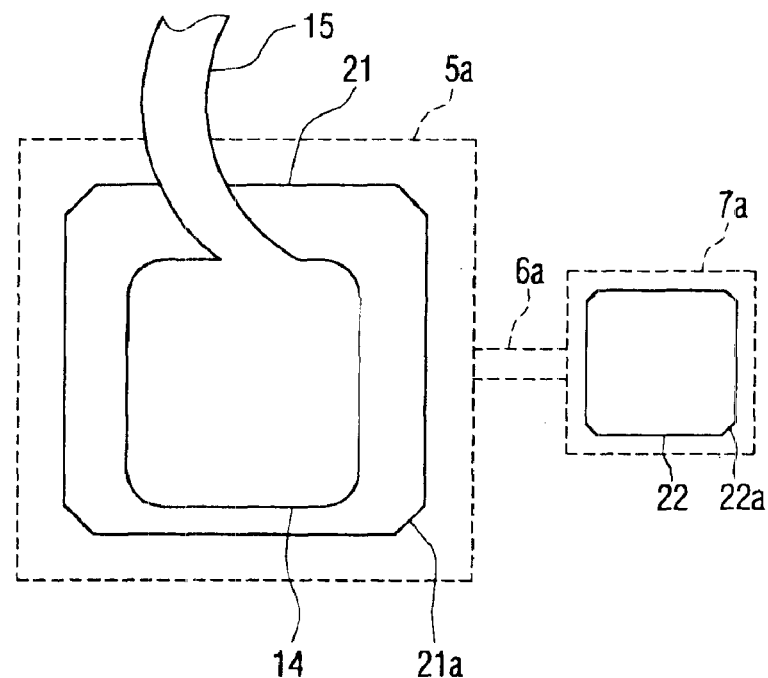
FIG. 3 is an enlarged plan view showing a bonding pad, a probe pad and an aluminum conductive line connecting therebetween according to the embodiment.
Figure 4:
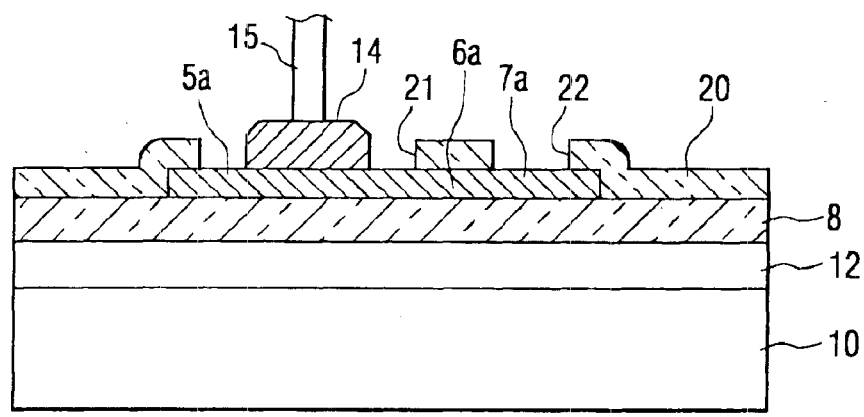
FIG. 4 is an enlarged partial cross sectional view showing the bonding pad, the probe pad and the aluminum line.

With reference to FIGS. 3 and 4, a bonding pad opening 21 is formed through the passivation film 20 on the bonding pad 5a. An external connection wire 15, which is an aluminum line, is bonded by ultrasonic bonding to a portion of a predetermined exposed region of the bonding pad 5a, which is exposed through the opening 21. Thus, the external connection wire 15 is joined to the bonding pad 5a through a bonding connection 14.

As shown in FIG. 3, the bonding connection 14 of the external connection wire 15 is formed in a portion of a predetermined region of the bonding pad 5d, which is exposed through the opening 21. A portion of the predetermined region of the bonding pad 5a is left exposed around the bonding connection 14. At this time, when a sharp corner is present in the opening 21 of the passivation film 20, residues, which include a relatively small amount of metal particles, can be accumulated and left in that corner at the time of dicing the wafer together with the glass base. The residues left in the sharp corner can react with water to promote corrosion of the bonding pad 5a.

Thus, in the present embodiment, in order to restrain accumulation of the residues in each corner 21a of the opening 21 of the passivation film 20, each corner 21a is chamfered to increase the angle of each corner 21a to an obtuse angle or to make each corner rounded. That is, by chamfering each corner 21a of the opening 21 of the passivation film 20, the residues, which include the relatively small amount of metal particles, can be easily removed from the corner 21a by, for example, washing, so that accumulation of residues in the opening 21 of the passivation film 20 can be restrained. As a result, even when the bonding pad 5a is exposed around the bonding connection 14, corrosion of the bonding pad 5a can be restrained.

The chamfering of the corners 21a of the opening 21 of the passivation film 20 can be performed as follows. That is, the passivation film (silicon nitride film) 20 is first deposited on the field oxide film 8. Then, in a photolithography process for forming the opening 21, a shape of a corresponding mask is configured to coincide with the shape of the opening 21 having the chamfered corners 21a.

In the case of the probe pad 7a, which is connected to the bonding pad 5a through the line 6a, each corner 22a of a probe pad opening 22 of the passivation film 20 formed on the probe pad 7a is also chamfered. In this way, in the probe pad 7a, corrosion of the probe pad 7a at the corner 22a of the opening 22 of the passivation film 20 can be similarly restrained.

However, when the probe needle is engaged with the probe pad 7a, a surface of the probe pad 7a is roughed, so that residues, which include the relatively small amount of metal particles, tend to be accumulated in the roughed surface portion of the probe pad 7a. Thus, the corrosion of the probe pad 7a can occur more easily in comparison to the bonding pad 5a. To address such a disadvantage, the bonding pad 5a and the probe pad 7a are separately provided, and the aluminum line 6a, which connects between the bonding pad 5a and the probe pad 7a, is covered with the passivation film 20. That is, even when corrosion of the probe pad 7a occurs, the corrosion will not be immediately extended to the bonding pad 5a since the probe pad 7a and the bonding pad 5a are separately provided. Furthermore, since the aluminum line 6a, which connects between the pads 5a, 7a, is covered with the passivation film 20, it is possible to sufficiently delay the progress of corrosion of the probe pad 7a to the bonding pad 5a.

Furthermore, in the present embodiment, the aluminum line 6a, which connects between the bonding pad 5a and the probe pad 7a, is arranged along an imaginary center line that connects between the center of the bonding pad 5a and the center of the probe pad 7a. Even when each corner 22a of the opening 22 on the probe pad 7a is chamfered, the corner 22a of the opening 22 can more easily become an initial point of corrosion in comparison to other portions. Thus, even in the case where the corrosion is initiated in the corner 22a, it is effective to provide the aluminum line 6a at the furthermost point, which is furthermost from each corner 22a, i.e., to provide the aluminum line 6a along the imaginary center line, which connects between the center of the bonding pad 5a and the center of the probe pad 7a, to restrain progress of the corrosion from the corner 22a to the bonding pad 5a.

Because of the above described measurements for restraining the corrosion of the bonding pad 5a, it is possible to achieve sufficient resistance against the corrosion even when the bonding pad 5a, the probe pad 7a and the aluminum line 6 are all arranged in the single plane in the manner shown in FIG. 4. By forming the pads 5a, 7a and the aluminum line 6a from the common material and arranging the pads 5a, 7a and the aluminum line 6a in the common plane, the manufacturing steps and the structure of the pressure sensor can be simplified.

In the above-described embodiment, the aluminum line is used as the external connection wire and is bonded to the bonding pad 5a by ultrasonic bonding. In this case, it is difficult to control the shape of the bonding connection 14. Thus, it is difficult to cover the entire bonding pad 5a with the bonding connection 14. However, in the present embodiment, even when the portion of the bonding pad 5a is exposed, corrosion of that portion can be restrained. Thus, it is possible to use the aluminum line as the external connection wire. When the aluminum line is used as the external connection wire, the manufacturing costs of the pressure sensor chip can be reduced since the cost of the aluminum line is lower than that of the gold line.

Furthermore, as described above, the pressure sensor chip of the present embodiment is diced together with the glass base. At that time, lubricant fluid is used to reduce friction or to remove or reduce the cutting debris or particles of the glass base. Such lubricant fluid may contain a relatively small amount of various metal components as impurities. When the metal impurities are left as residues, corrosion of the bonding pad 5a is promoted. However, because of the above structure, which restrains accumulation of the above residues, corrosion of the bonding pad 5a can be advantageously restrained even in the case where the pressure sensor chip is diced together with the glass base.

Modifications of the above embodiment will be described.

In the above embodiment, the openings 21, 22 of the passivation film 20 provided on the bonding pad 5a and the probe pad 7a, respectively, are shaped into the corresponding generally rectangular shape, and the four corners of each opening 21, 22 is chamfered.

However, the shape of each opening 21, 22 is not limited to the above-described one and can be modified into any other appropriate shape as long as it does not have a corner that is angled equal to or less than 90 degrees. For example, the shape of each opening 21, 22 can be any other polygonal shape that has a plurality of corners, and each of the plurality of corners has an obtuse angle or is chamfered. Alternatively, the shape of each opening 21, 22 can be a generally circular shape, a generally ellipsoidal shape (including a race-track shape, which includes two generally parallel lines connected by two arcuate lines) or any other suitable closed curve, such as a pear-shape.

Figure 5A:
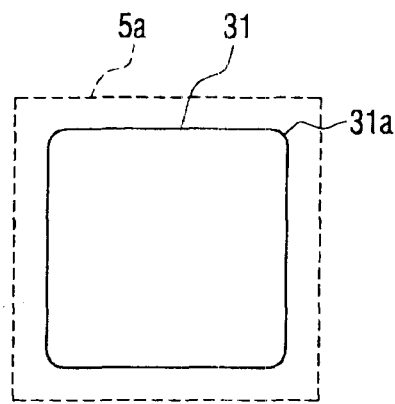
FIG. 5A is a schematic plan view showing a modification of an opening provided in a passivation film formed on the bonding pad and/or the probe pad.
Figure 5B:
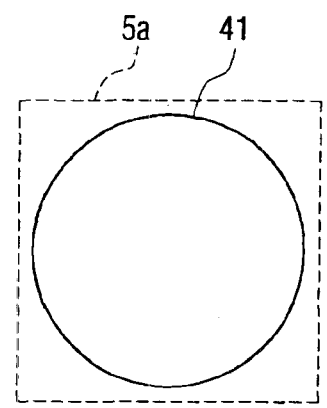
FIG. 5B is a schematic plan view showing another modification of the opening provided in the passivation film formed on the bonding pad and/or the probe pad.
Figure 5C:
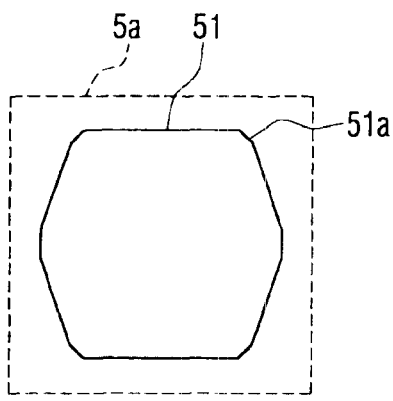
FIG. 5C is a schematic plan view showing another modification of the opening provided in the passivation film formed on the bonding pad and/or the probe pad.
Figure 5D:
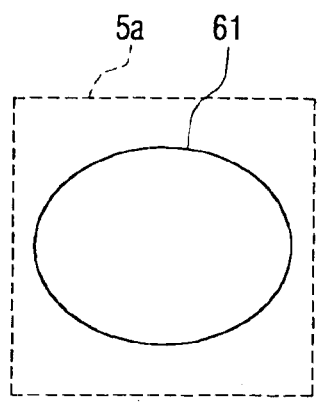
FIG. 5D is a schematic plan view showing another modification of the opening provided in the passivation film formed on the bonding pad and/or the probe pad.

More specifically, as shown in FIG. 5A, as an alternative to any one of the openings 21, 22, an opening 31 can be formed into a generally rectangular shape, and each corner 31a can be shaped into a curved corner. Further alternatively, as shown in FIG. 5B, an entire opening 41 can have a generally circular shape. Further alternatively, an opening 51 can have a polygonal shape (in FIG. 5C, this is a hexagonal shape) other than the rectangular shape, and each corner 51a of the opening 51 can be chamfered or can be shaped into a curved corner. However, it should be understood that when the number of corners of the opening is increased, an angle of the corner is increased and approaches a circle. Further alternatively, as shown in FIG. 5D, an opening 61 can have a generally ellipsoidal shape. In view of restraining accumulation of the residues in each corner, a polygonal shape that has more than eight corners can be regarded as a generally circular shape, and each corner of that polygonal shape does not need to be chamfered or curved.

Figure 6A:
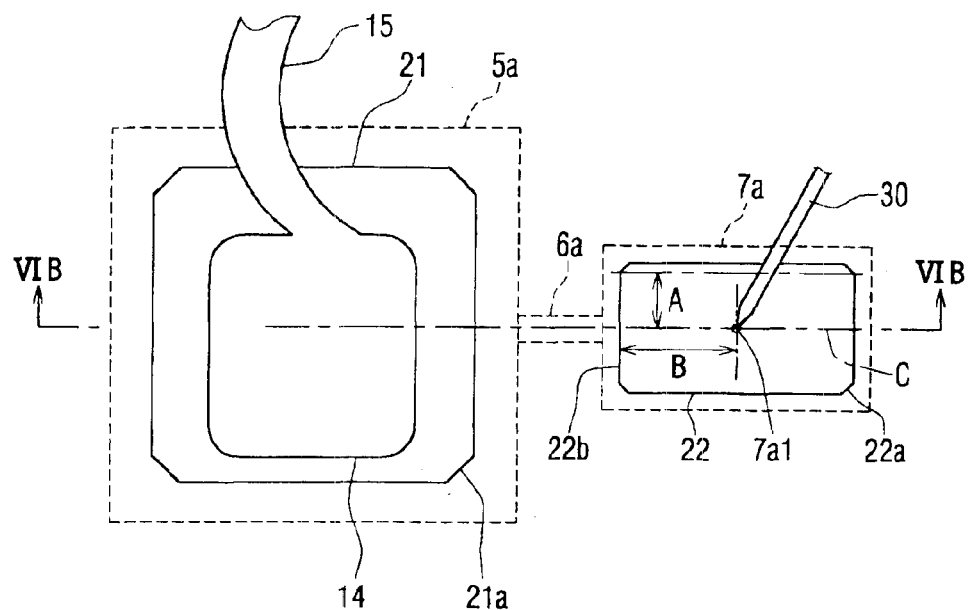
FIG. 6A is a schematic plan view showing a bonding pad, a probe pad and an aluminum conductive line connecting therebetween according to a modification of the embodiment.
Figure 6B:
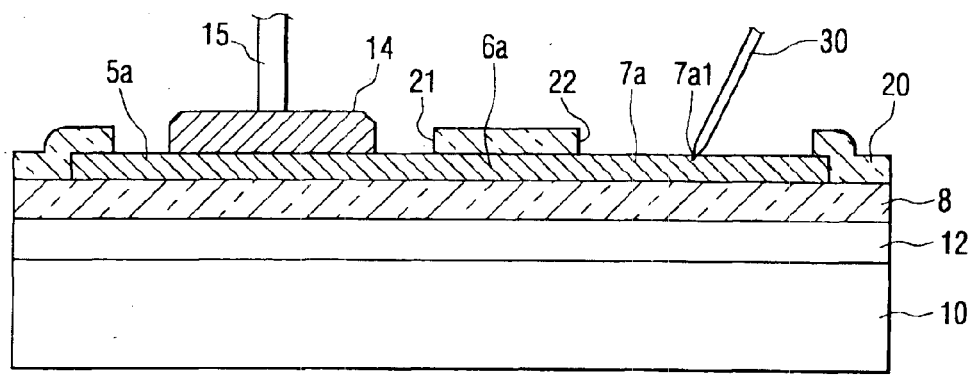
FIG. 6B is a cross sectional view along line VIB—VIB in FIG. 6A.

With reference to FIGS. 6A and 6B, another modification of the above embodiment will be described. This modification is substantially the same as the above embodiment shown, for example, in FIGS. 3 and 4 except that each probe pad opening 22 of the passivation film 20 has an elongated rectangular shape that is elongated along the imaginary center line C, which connects between the center of the bonding pad 5a–5d and the center of the probe pad 7a–7d, as shown in FIG. 6A.

With reference to FIG. 6A, a probe engaging point 7a1 of the probe pad 7a, which is engaged with the test probe (also referred to as the inspection probe) 30 at the time of testing the semiconductor device 1 and is thus dented as shown in FIG. 6B, preferably satisfies the following condition. That is, a distance A in a direction perpendicular to the imaginary center line C between the imaginary center line C and a closest one of the corners 22a of the probe pad opening 22, which is closest to the imaginary center line C, is equal to or less than a distance B along the imaginary center line C between the probe engaging point 7a1 of the probe pad 7a and a bonding pad side edge 22b of the probe pad opening 22 (i.e., A≦B).

In general, in terms of effects of corrosions of the probe pad 7a to the bonding pad 5a, the effect of corrosion initiated in the probe pad engaging point 7a1 is greater than the effect of the corrosion initiated in the corner 22a of the opening 22. In one previously proposed case where the probe pad opening has a square shape with 90 degree corners, and the test probe is engaged with the probe pad at the center of the probe pad, the distance between the corner of the probe pad opening and the imaginary center line, which connects between the center of the bonding pad and the center of the probe pad, is substantially equal to the distance between the probe engaging point of the probe pad and the bonding pad side edge of the probe pad opening. Thus, the time required for the corrosion of the corner of the probe pad opening to reach the bonding pad is substantially the same as the time required for the corrosion of the probe engaging point to reach the bonding pad. In such a case, it is desirable to increase the time required for the corrosion of the probe engaging point to reach the bonding pad in comparison to the time required for the corrosion of the corner of the probe pad opening to reach the bonding pad to delay the effect of the corrosion initiated in the probe engaging point of the probe pad to the bonding pad.

In the above modification, the probe engaging point 7a1 is further spaced apart from the bonding pad 5a in comparison to the nearest corner 22a of the opening 22. As a result, the time required for the corrosion of the probe pad engaging point 7a1 to reach the bonding pad 5a is advantageously increased in comparison to the time required for the corrosion of the corner 22a of the probe pad opening 22 to reach the bonding pad 5a. Furthermore, in the above modification, because of the elongated rectangular shape of the probe pad opening 22, it is possible to position the probe engaging point 7a1 in the center of the probe pad opening 22 while satisfying the relationship of A≦B.

To test the semiconductor device, a distal end of the test probe 30 is engaged with the probe engaging point 7a1 of the exposed region of the probe pad 7a, which is exposed through the probe pad opening 22 of the passivation film 20. Then, electrical voltage is applied from the test probe 30 to the probe pad 7a to test electrical characteristics of the semiconductor device.

It should be noted although the dent of the probe engaging point 7a1 is depicted only in FIGS. 6A and 6B, a similar dent of the probe engaging point is created in the probe pads 7a–7d of the above embodiment, for example, shown in FIGS. 3 and 4. Furthermore, the relationship between the distance A and the distance B is also equally applicable to the probe pad 7a–7d provided with the generally square shaped probe pad opening 22 shown in FIGS. 1–4 as well as the probe pads provided with any other polygonal probe pad opening.

Figure 7A:
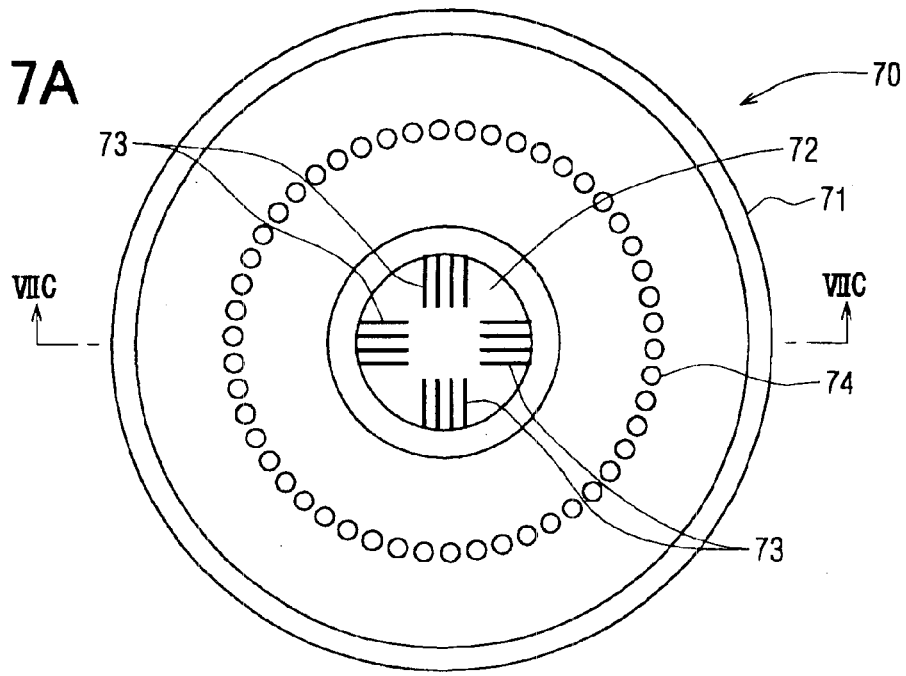
FIG. 7A is a plan view of a probe card.
Figure 7B:
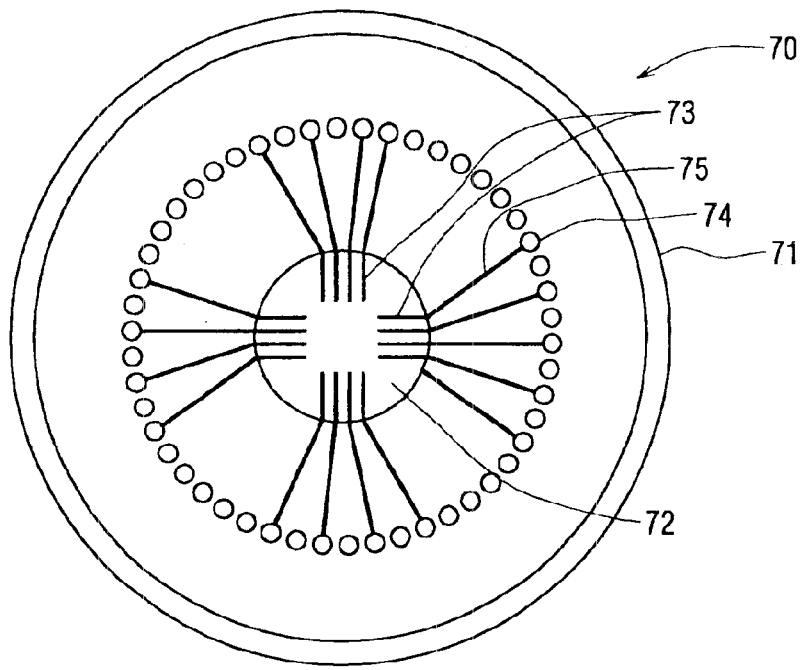
FIG. 7B is a back view of the probe card of FIG. 7A.
Figure 7C:
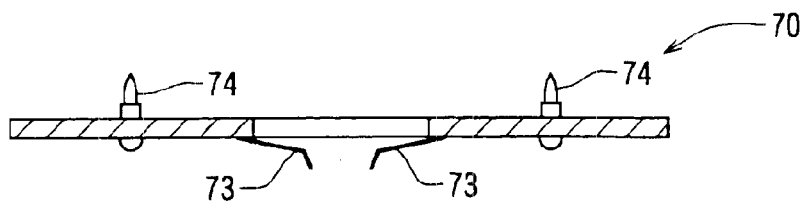
FIG. 7C is a cross sectional view along line VIIC—VIIC in FIG. 7A.

With reference to FIGS. 7A to 7C, another modification will be described. In place of the test probes, such as the test probe 30 of FIGS. 6A and 6B, a probe card 70, which has a plurality of test probes (also referred to as inspection probes) 73, can be used. More specifically, the probe card 70 includes a probe board 71, which is attached to a test apparatus (not shown) for testing a wafer upon installation of the probe card 70 to the test apparatus. The probe board 71 has a through hole 72 that penetrates through the center of the probe board 71. Furthermore, in the probe board 71, a plurality of electrical terminals 74 is circumferentially arranged such that each terminal 74 extends through the probe board 71 in a manner shown in FIG. 7C and is connected to a corresponding terminal of the test apparatus upon installation of the probe card 70 to the test apparatus. Each probe 73 is connected to a corresponding one of the terminals 74 through an electrical line 75 and extends radially inward from an inner peripheral edge of the through hole 72. A distal end (free end) of the test probe 73 extends obliquely, as shown in FIG. 7C and contacts with a corresponding one of the probe pads 7a–7d in a manner similar to that of the test probe 30 of FIGS. 6A and 6B. The use of the probe card 70 allows easy positioning of the test probe relative to the corresponding probe pad 7a–7d.

Additional advantages and modifications will readily occur to those skilled in the art. The invention in its broader terms is therefore not limited to the specific details, representative apparatus, and illustrative examples shown and described.

What is claimed is:

1. A semiconductor device comprising:
   a substrate;
   a bonding pad that is located on one side of the substrate;
   a passivation film that is provided on the bonding pad and that has a bonding pad opening through which a predetermined exposed region of the bonding pad is exposed;
   an external connection wire that is externally connected and that is bonded to a portion of the predetermined exposed region of the bonding pad, which is exposed through the bonding pad opening of the passivation film, wherein the bonding pad opening of the passivation film has one of:
      a polygonal shape that has a plurality of corners, wherein each of the plurality of corners has an obtuse angle or is chamfered;
      a generally circular shape;
      a generally ellipsoidal shape; and
   a probe pad that is located on the one side of the substrate and is electrically connected to the bonding pad through a conductive line covered with the passivation film, wherein:
   the probe pad is provided to be engaged with an inspection probe at time of testing the semiconductor device;
   the passivation film is also located on the probe pad and further includes a probe pad opening, through which a predetermined exposed region of the probe pad is exposed; and
   the probe pad opening of the passivation film has one of:
      a polygonal shape that has a plurality of corners, wherein each of the plurality of corners has an obtuse angle or is chamfered;
      a generally circular shape; and
      a generally ellipsoidal shape.

2. The semiconductor device according to claim 1, wherein the bonding pad, the probe pad and the conductive line are made of a common material and are located in a common plane.

3. The semiconductor device according to claim 1, wherein the conductive line extends along an imaginary center line, which connects between a center of the bonding pad and a center of the probe pad.

4. The semiconductor device according to claim 3, wherein: the probe pad opening of the passivation film has the polygonal shape; a distance in a direction perpendicular to the imaginary center line between the imaginary center line and a closest one of the corners of the probe pad opening, which is closest to the imaginary center line, is equal to or less than a distance along the imaginary center line between a probe engaging point of the probe pad, which is engaged with the inspection probe at the time of testing the semiconductor device, and a bonding pad side edge of the probe pad opening.

5. The semiconductor device according to claim 1, wherein the external connection wire is made of aluminum and is bonded to the bonding pad by ultrasonic bonding.

6. The semiconductor device according to claim 1, further comprising a glass base that is located on the other side of the substrate and supports the substrate.

* * * * *